(12) United States Patent
Chuang et al.

(10) Patent No.: US 12,040,385 B2
(45) Date of Patent: *Jul. 16, 2024

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Chi-Yi Chuang, Hsinchu (TW); Ching-Wei Tsai, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,476

(22) Filed: Apr. 24, 2023

(65) Prior Publication Data
US 2023/0261093 A1 Aug. 17, 2023

Related U.S. Application Data

(60) Continuation of application No. 17/687,091, filed on Mar. 4, 2022, now Pat. No. 11,637,196, which is a
(Continued)

(51) Int. Cl.
*H01L 29/66* (2006.01)
*H01L 21/8234* (2006.01)
(Continued)

(52) U.S. Cl.
CPC ........... *H01L 29/66795* (2013.01); *H01L 21/823431* (2013.01); *H01L 29/41791* (2013.01); *H01L 29/785* (2013.01)

(58) Field of Classification Search
CPC ......... H01L 29/66795; H01L 29/41791; H01L 29/785; H01L 21/823431
See application file for complete search history.

(56) References Cited

U.S. PATENT DOCUMENTS

2015/0333145 A1* 11/2015 Chudzik ........... H01L 29/66795
438/283
2016/0380056 A1* 12/2016 Yeo ................... H01L 29/42392
438/283

* cited by examiner

*Primary Examiner* — Marc Anthony Armand
(74) *Attorney, Agent, or Firm* — WPAT LAW; Anthony King

(57) ABSTRACT

Present disclosure provides a method for forming a semiconductor structure, including forming a dielectric layer over a semiconductor substrate, patterning an insulator stripe over the semiconductor substrate, including forming an insulator layer over the semiconductor substrate and at a bottom of the insulator stripe, depositing a semiconductor capping layer continuously over the insulator stripe, wherein the semiconductor capping layer includes crystalline materials, wherein the semiconductor capping layer is free from being in direct contact with the semiconductor substrate, and cutting off the semiconductor capping layer between the insulator stripes, forming a gate, wherein the gate is in direct contact with the semiconductor capping layer, a first portion of the semiconductor capping layer covered by the gate is configured as a channel structure, and forming a conductible region at a portion of the insulator stripe not covered by the gate stripe by a regrowth operation.

20 Claims, 24 Drawing Sheets

Related U.S. Application Data division of application No. 16/445,616, filed on Jun. 19, 2019, now Pat. No. 11,271,094.

(60) Provisional application No. 62/772,994, filed on Nov. 29, 2018.

(51) Int. Cl.
*H01L 29/417* (2006.01)
*H01L 29/78* (2006.01)

SEMICONDUCTOR STRUCTURE AND METHOD OF MANUFACTURING THE SAME

CROSS REFERENCE TO RELATED APPLICATIONS

This application claims the benefit of prior-filed provisional application No. 62/772,994, filed Nov. 29, 2018, prior-filed U.S. application Ser. No. 16/445,616, filed Jun. 19, 2019, and prior-filed U.S. application Ser. No. 17/687,091, filed Mar. 4, 2022, which is incorporated by reference in its entirety.

BACKGROUND

To achieve an increase in circuit density of integrated circuits, the size of semiconductor devices, such as field-effect transistors, within such integrated circuits has decreased. Decreasing the size of a semiconductor device can however, result in a reduction in the length of a channel of the semiconductor device. Reducing the channel length can result in a source region and a drain region of the semiconductor device being closer to one another, which can allow the source and drain region to exert undue influence over the channel, or rather over carriers within the channel, commonly referred to as short-channel effects. Consequently, a gate of a semiconductor device that suffers from short-channel effects has reduced control over the channel, which, among other things, inhibits the ability of the gate to control on and/or off states of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
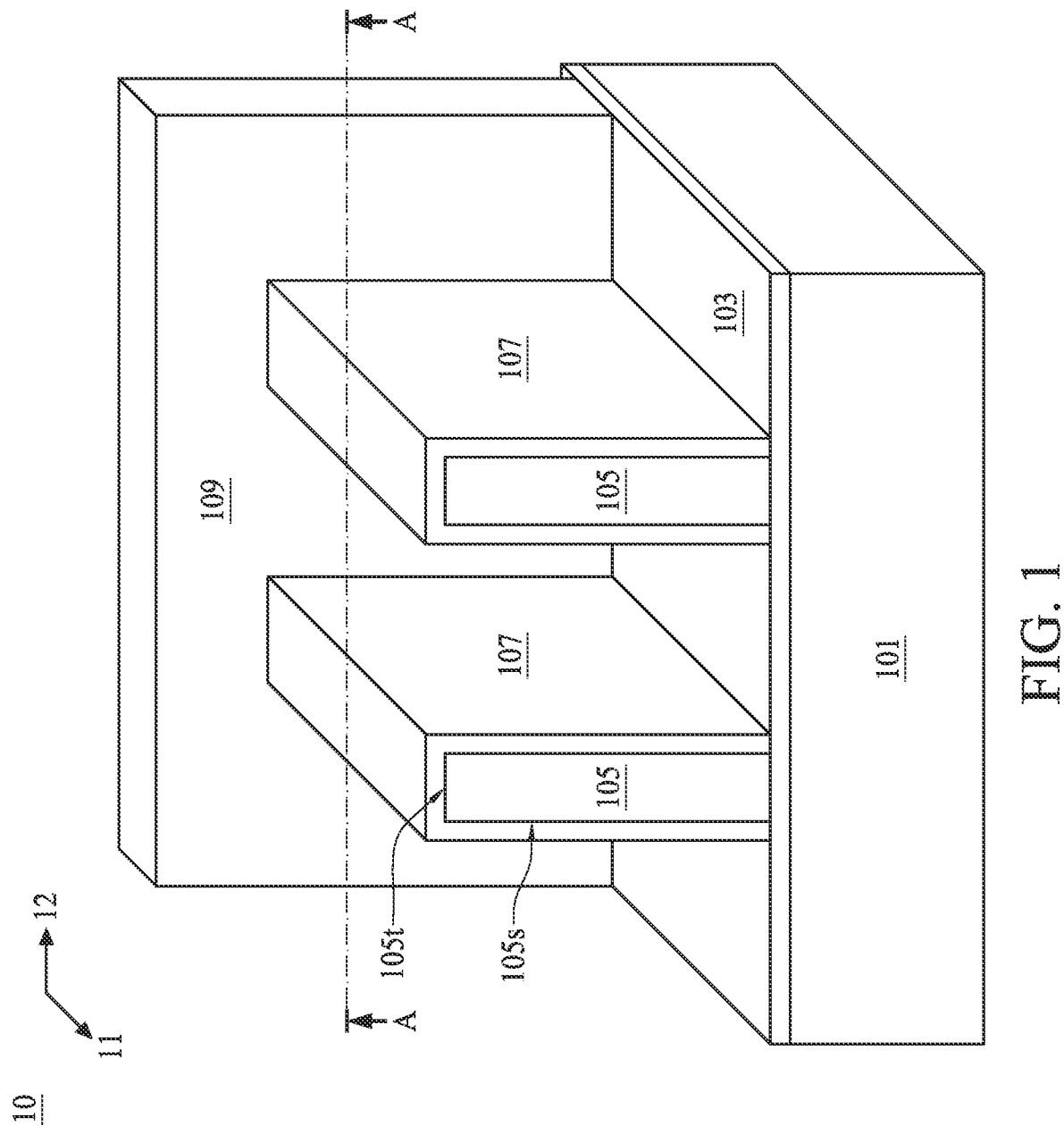
FIG. 1 is a perspective view of a FinFET structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

One or more semiconductor devices and techniques for forming such semiconductor devices are provided herein. A semiconductor device, such as a fin field-effect transistor (FinFET), comprises a fin formed on a semiconductor substrate. A gate structure surrounds at least a portion of the fin, such as a channel within a top fin portion of the fin. A source region is formed within a first portion of the fin on a first side of the channel, and a drain region is formed within a second portion of the fin on a second side of the channel. Because the gate structure is formed around the channel on or multiple sides, the gate structure has relatively greater control over the channel, and carriers therein, in relation to a gate structure formed merely above the channel, for example. Along with the line width scale reduction, FinFET with a channel length comparable to depletion layer width may achieve full depletion. However, FinFET with a channel length longer than depletion layer width may still suffer non-fully depletion at or above the threshold voltage during operation. Consequently, leakage current could be induced due to short channel effect. Conventionally, fin width of the FinFET having a channel length longer than depletion layer width may be decreased in order to achieve fully depletion at the channel during operation. Nevertheless, carrier mobility decreases due to the reduced dimension of the gate-channel interface.

Accordingly, present disclosure provides a FinFET device which achieves fully depletion at active region, or channel, under operation. Such effect is not at the expense of shortening channel length or reducing fin width.

Silicon-on-insulator (SOI) technology reduces parasitic device capacitance efficiently, thereby improving performance. In order to make most use of SOI technology's advantages in manufacturing a FinFET device, the fin-shaped insulator is designed on a substrate and the semiconductor film is built as a cap on top of the fin. In this invention, new structure of FinFET on fin-shaped insulator on a substrate is proposed to combine the advantages of FinFET and SOI more thoroughly.

Referring to FIG. 1, FIG. 1 is a perspective view of a FinFET structure 10, in accordance with some embodiments of the present disclosure. A substrate 101 is shown having a dielectric layer 103 formed thereon. The substrate 101 may be formed of silicon, for example. Although the substrate 101 may be depicted in FIG. 1 as a bulk wafer including a single material (e.g., a bulk silicon wafer), in other examples, a semiconductor-on-insulator or silicon-on-insulator (SOI) wafer, or a glass substrate may instead be used. Where such an SOI wafer is used, the dielectric layer 103 may be the insulating layer (e.g., an oxide layer) that is formed between a top silicon layer (not shown in FIG. 1) and a silicon base layer (e.g., a bottom silicon layer) of the SOI wafer.

Any suitable material for the substrate 101 may be used, and the material for the substrate 101 may not be limited to silicon. For example, the substrate 101 may be a bulk substrate that may include gallium arsenide, germanium, or any other material or combination of materials. Further, the substrate 101 may include other features or structures that are formed on or in the substrate 101. The dielectric layer 103 may include a dielectric material that enables etching of the substrate 101. In one example, the substrate 101 may be monocrystalline silicon, and the dielectric layer 103 may include silicon nitride that is deposited substantially over the substrate 101.

A plurality of insulator fins 105 positioned over the dielectric layer 103, from a perspective view, extending along a first direction 11 over the substrate 11. As shown in FIG. 1, the plurality of insulator fins 105 can be a core of a first stripe, wherein the core is wrapped, at least from a top surface 105*t* and/or a sidewall 105*s* of the insulator fin 105, by a semiconductor cap, or a capping layer 107. In combination, the insulator fin 15 and the capping layer 107 form a first stripe extending along the first direction 11 over the substrate 11. A gate 109 cross over the plurality of insulator fins 105 along a second direction 12 over the substrate 101. In some embodiments, the second direction 12 is substantially perpendicular to the first direction 11. The gate 109 forms a second stripe extending along the second direction over the semiconductor substrate 101. The second stripe at least contacts with the capping layer 107 of the first stripe. Alternatively stated, the gate 109 is in contact with the portion of the capping layer 107 wrapping the top surface 105*t* and the sidewalls 105*s* of each of the plurality of insulator fins 105. In some embodiments, the insulator fin 105 and the dielectric layer 103 can be a continuous region patterned from the insulating layer of an SOI wafer. In some embodiments, the insulator fin 105 and the dielectric layer 103 can be composed of insulating materials, high-k dielectric material, or semiconductor derivatives, such as $SiO_2$, $HfO_2$, SiOCN, or GeO.

In some embodiments, the capping layer can be composed of crystalline, poly-crystalline, or semi-crystalline semiconductor materials such as Si, SiGe, Ge, other III-V materials, or 2-dimensional materials such as graphene, $MoS_2$, $WSe_2$, or $HfTe_2$.

In FIG. 1, the first stripe, or the combination of the insulator fin 105 and the capping layer 107, exposing from the second stripe, or the gate 109, includes a source or a drain (hereinafter a S/D region). In some embodiments, the S/D region can be the portion of the capping layer 107 exposed from the gate 109 and laterally abutting the gate 109. In some embodiments, the S/D region can be formed by an ion implantation operation or an etching operation followed by an epitaxial regrowth operations, as will be addressed later in the present disclosure.

Figure 2A:
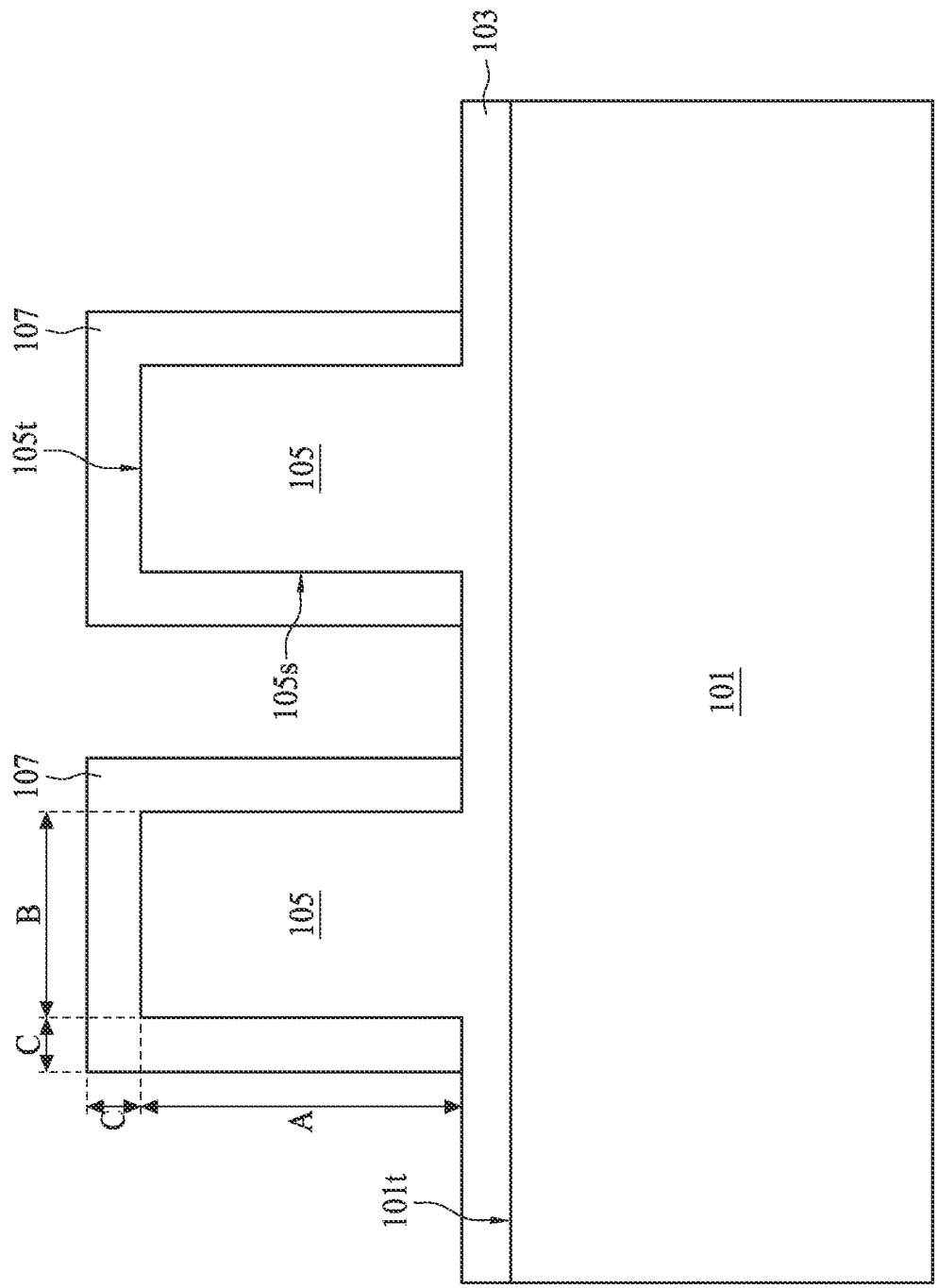
FIG. 2A is a cross sectional view of a FinFET structure, in accordance with some embodiments of the present disclosure.

Referring to FIG. 2A, FIG. 2A is a cross sectional view of a FinFET structure 10 dissecting along line AA, in accordance with some embodiments of the present disclosure. In some embodiments, the capping layer 107 shown in FIG. 2A is the S/D region of the FinFET structure 10. Each of the plurality of insulator fins 105 has a principal dimension A, as opposed to a minor dimension B, as shown in FIG. 2A. The principal dimension A is substantially perpendicular to a top surface 101*t* of the substrate 101. The capping layer 107 is wrapping at least on the top surface 105*t* along the minor dimension B and the sidewall 105*s* along the principal dimension A of the insulator fin 105. A value of the principal dimension A is measured from the top surface 105*t* to a bottom of the insulator fin 105, and a value of the minor dimension B is measured from the one sidewall to an opposite sidewall of the insulator fin 105. In some embodiments, the principal dimension A is in a range of from about 5 nm to about 100 nm, and the minor dimension B is in a range of from about 2 nm to about 30 nm. When the principal dimension A is greater than 100 nm while the minor dimension B is within the aforesaid range, the insulator fin 105 has a high aspect ratio, causing the insulator fin 105 susceptible to deform or collapse during subsequent manufacturing operations, for example, poly gate formation over the plurality of the insulator fins 105. When the principal dimension A is smaller than 5 nm while the minor dimension B is within the aforesaid range, the contact area of the capping layer 107 and the insulator fin 105 is too small to render a reasonable channel dimension in a FinFET device. When the minor dimension B is greater than 30 nm while the principal dimension A is within the aforesaid range, the number of transistor per unit chip area is significantly reduced. When the minor dimension B is smaller than 2 nm while the principal dimension A is within the aforesaid range, too high the aspect ratio will again causing the insulator fin 105 susceptible to deform or collapse during subsequent manufacturing operations.

As shown in FIG. 2A, a thickness C of the capping layer 107 is determined so as to allow formation of a fully depleted region in the capping layer 107 under a predetermined bias of operation. In some embodiments, the thickness C of the capping layer 107 can be in a range of from about 40 Å to about 20 nm. When the thickness C of the capping layer 107 is thicker than 20 nm, the number of transistor per unit chip area is significantly reduced. When the thickness C of the capping layer 107 is thinner than 40 Å, the crystallinity of the capping layer 107, which in some embodiments is a single crystal epitaxial layer, can be deteriorated. In addition, the capping layer 107 thinner than 40 Å can raise manufacturing difficulties in subsequent manufacturing operation, as will be further discussed in FIG. 14 and FIG. 15 of present disclosure.

The dielectric layer 103 is positioned between the bottom of the insulator fins 105 and the top surface of the substrate 101. In some embodiments, the dielectric layer 103 is not surrounding sidewalls of the insulator fins 105. The dielectric layer 103 is positioned between a subsequently formed metal gate in contact with the capping layer 107 and the substrate 101. Alternatively stated, the capping layer 107 is not in contact with the substrate 101, thereby effectively reduce the leakage current flowing to the substrate 101.

Figure 2B:
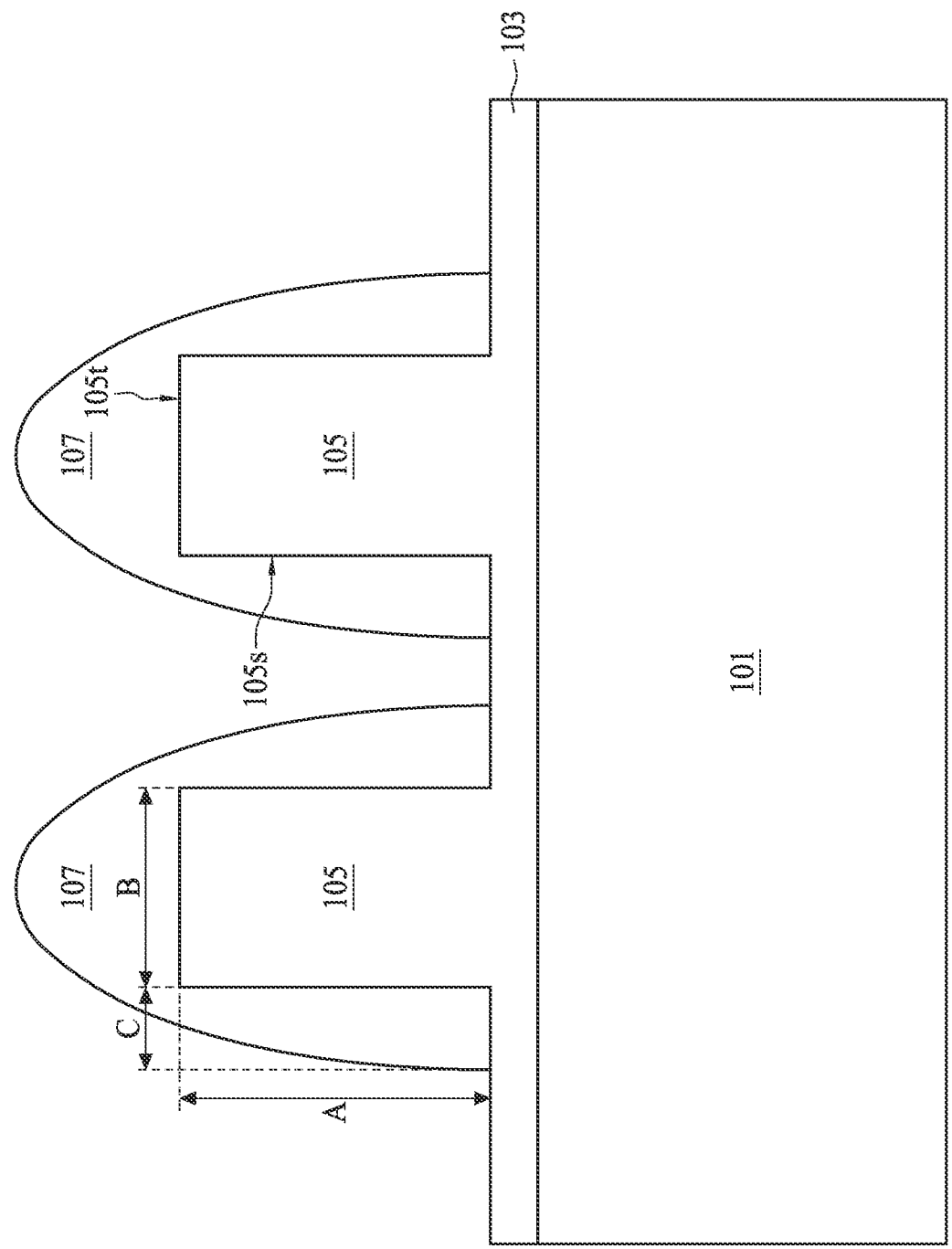
FIG. 2B is a cross sectional view of a FinFET structure, in accordance with some embodiments of the present disclosure.

Referring to FIG. 2B, FIG. 2B is a cross sectional view of a FinFET structure 10 dissecting along line AA, in accordance with some embodiments of the present disclosure. In some embodiments, the capping layer 107 shown in FIG. 2B is the S/D region of the FinFET structure 10. As shown in FIG. 2B, the capping layer 107 is wrapping at least on the top surface 105t along the minor dimension B and the sidewall 105s along the principal dimension A of the insulator fin 105. Values of the principal dimension A, the minor dimension B, and the thickness C of the capping layer 107 can be referenced to those discussed in FIG. 2A and are not repeated here for brevity. The deposition of the capping layer 107 may not possess equal thickness everywhere along the top surface 105t and the sidewalls 105s of the insulator fin 105, for example, a rounding feature of the capping layer 107 can be observed at the corners of the insulator fins 105. The thickness C of the capping layer 107 under this condition can be measured at a bottom of the capping layer 105, where the capping layer 105 contacting the dielectric layer 103.

Figure 3:
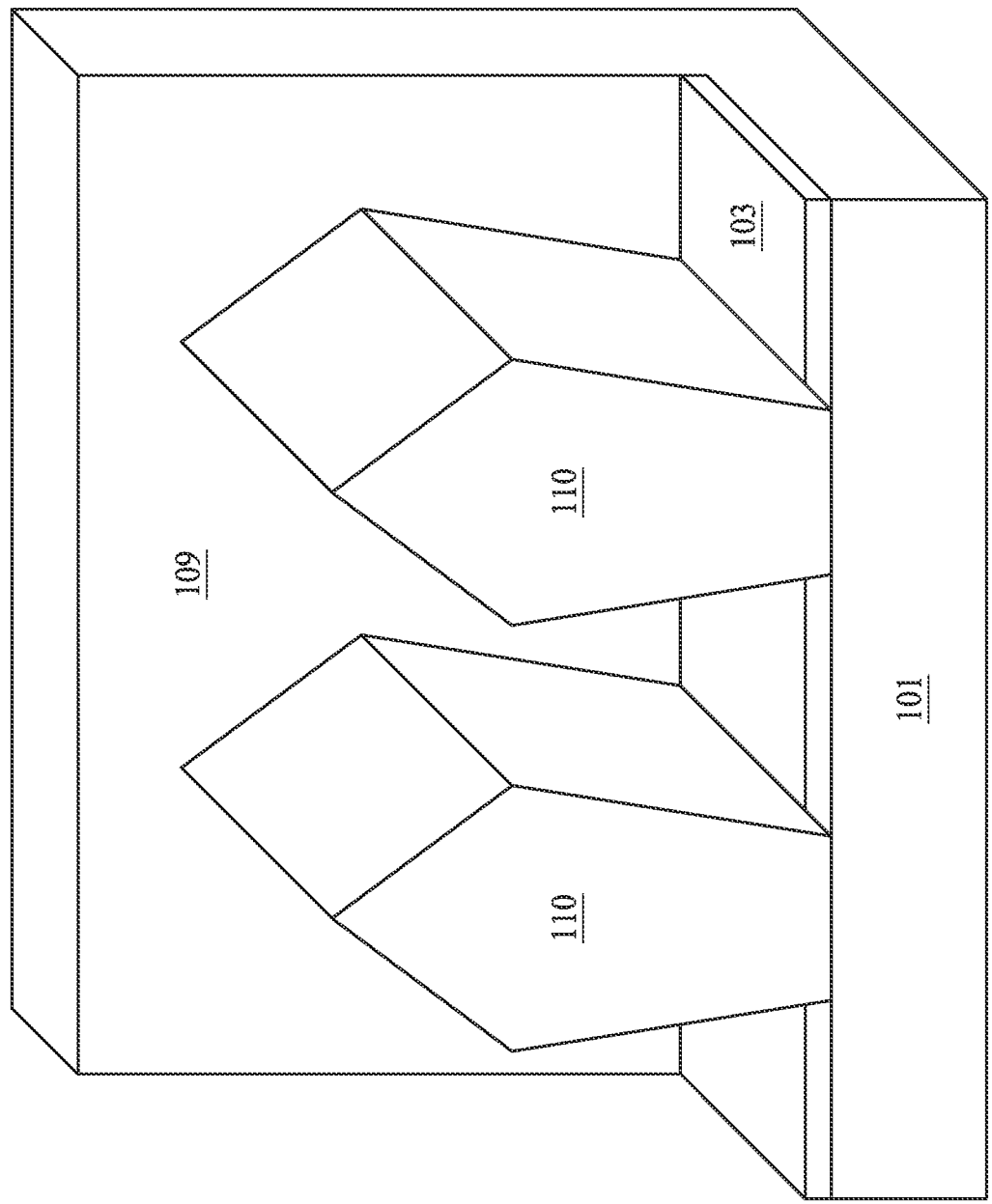
FIG. 3 is a perspective view of a FinFET structure, in accordance with some embodiments of the present disclosure.

FIG. 3 is a perspective view of a FinFET structure, in accordance with some embodiments of the present disclosure. Same numerical labels in FIG. 3 and FIG. 1 direct to substantially identical elements or equivalents thereof, and can be referenced thereto. In FIG. 3, the insulator fins 105 and the capping layer 107 are covered under the gate 109. Compared to FIG. 1, the portion of the insulator fin 105 and the capping layer 107 exposed from the gate 109 is now removed and replaced by conductible region 110 configured as a S/D region of the FinFET structure 10. The conductible region 110 is disposed along the first direction 11 over the substrate 101 and laterally abutting the gate 109.

Figure 4:
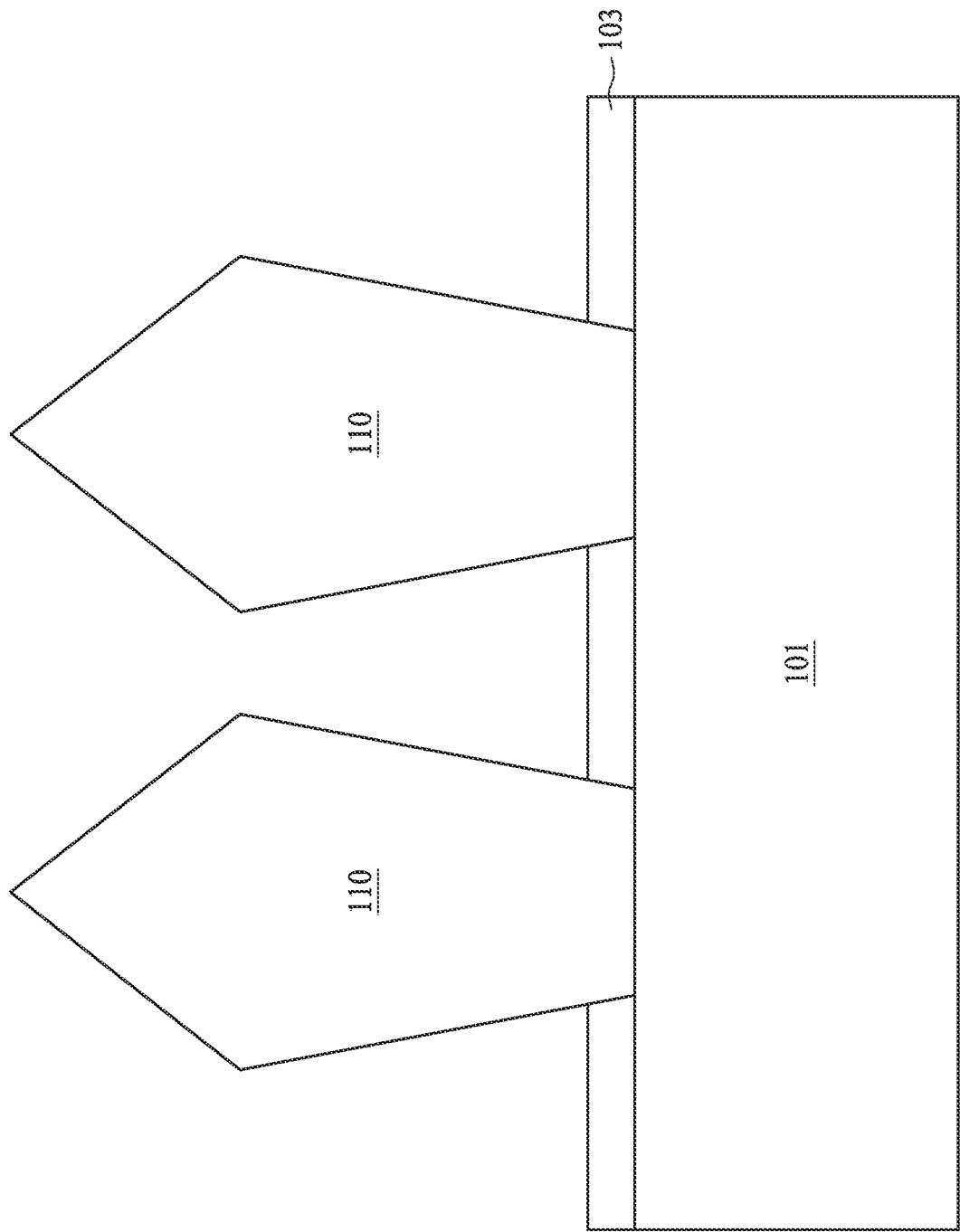
FIG. 4 is a cross sectional view of a FinFET structure, in accordance with some embodiments of the present disclosure.

Referring to FIG. 4, FIG. 4 is a cross sectional view of a FinFET structure 10, in accordance with some embodiments of the present disclosure. Note the portion of the insulator fins 105 and the capping layer 107 covered under the gate 109, as shown in FIG. 3, possesses a cross sectional view previously addressed in FIG. 2A or FIG. 2B, is not repeated here for brevity. However, the conductible region 110 configured as a S/D region in FIG. 3 possesses a cross sectional view shown in FIG. 4. In some embodiments, the conductible region 110 may be in contact with the top surface of the substrate 101. In some embodiments, the dielectric layer 103 may separate the conductible region 110 from the top surface of the substrate 101.

Figure 5B:
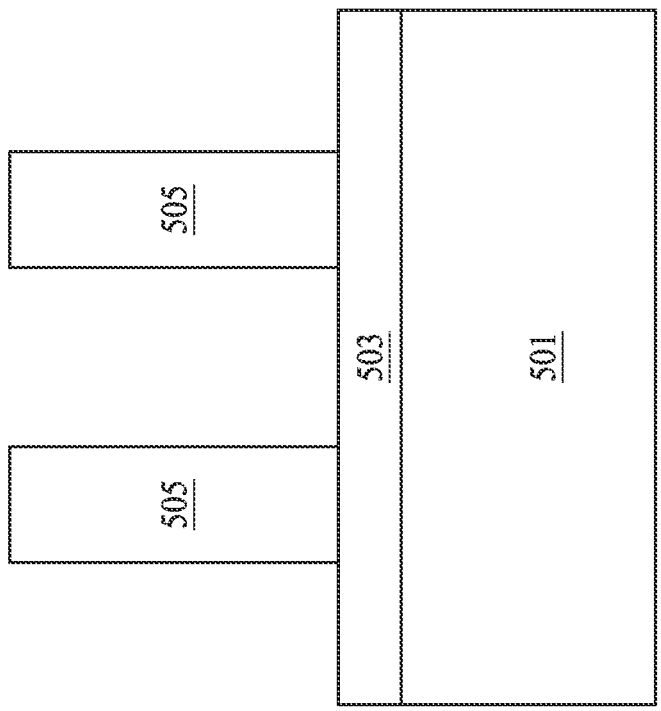
FIG. 5B is a cross sectional view of a FinFET structure, in accordance with some comparative embodiments of the present disclosure.
Figure 5A:
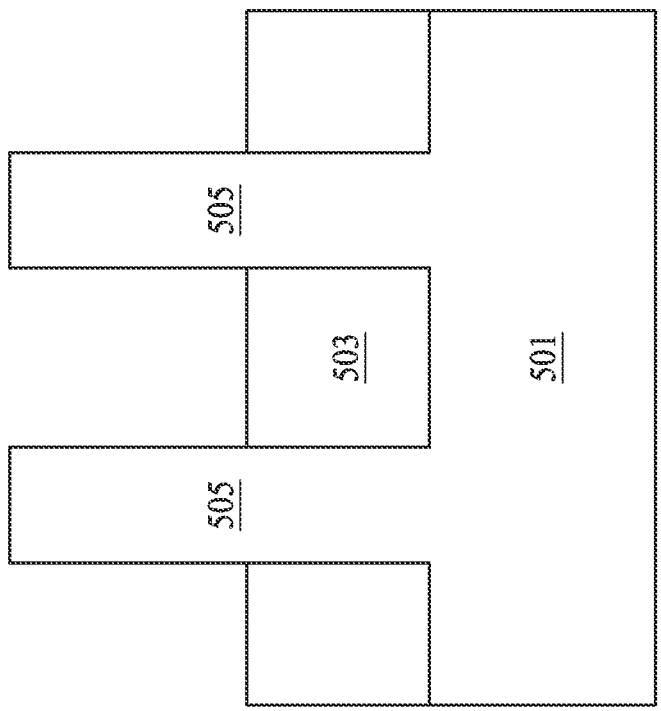
FIG. 5A is a cross sectional view of a FinFET structure, in accordance with some comparative embodiments of the present disclosure.

Referring to FIG. 5A and FIG. 5B, FIG. 5A is a cross sectional view of a comparative FinFET structure, and FIG. 5B is a cross sectional view of a comparative FinFET structure, in accordance with some comparative embodiments of the present disclosure. Compared to the FinFET structure of current disclosure, the FinFET structures shown in FIG. 5A and FIG. 5B both include a plurality of semiconductor fins 505 and dielectric layer 503. The semiconductor fin 505 in FIG. 5A is patterned from a semiconductor substrate 501, therefore, the semiconductor fin 505 and the semiconductor substrate 501 form a continuous semiconductor region. The dielectric layer 503 is formed over the top surface of the semiconductor substrate 501 and partially surrounding the semiconductor fins 505. The semiconductor fin 505 in FIG. 5B, however, is patterned from an upper semiconductor layer of an SOI wafer. A dielectric layer 503 of the SOI wafer is disposed between the semiconductor fin 505 and the lower semiconductor layer of the SOI wafer, electrically isolating the semiconductor fin 505 from the semiconductor substrate 501.

The two comparative embodiments shown in FIG. 5A and FIG. 5B at least different from the embodiments of present disclosure in that the semiconductor fin 505 is composed of semiconductor materials instead of insulator. The semiconductor fin 505 is a bulk structure without a core and a capping layer as previously addressed in embodiments of present disclosure.

Figure 6:
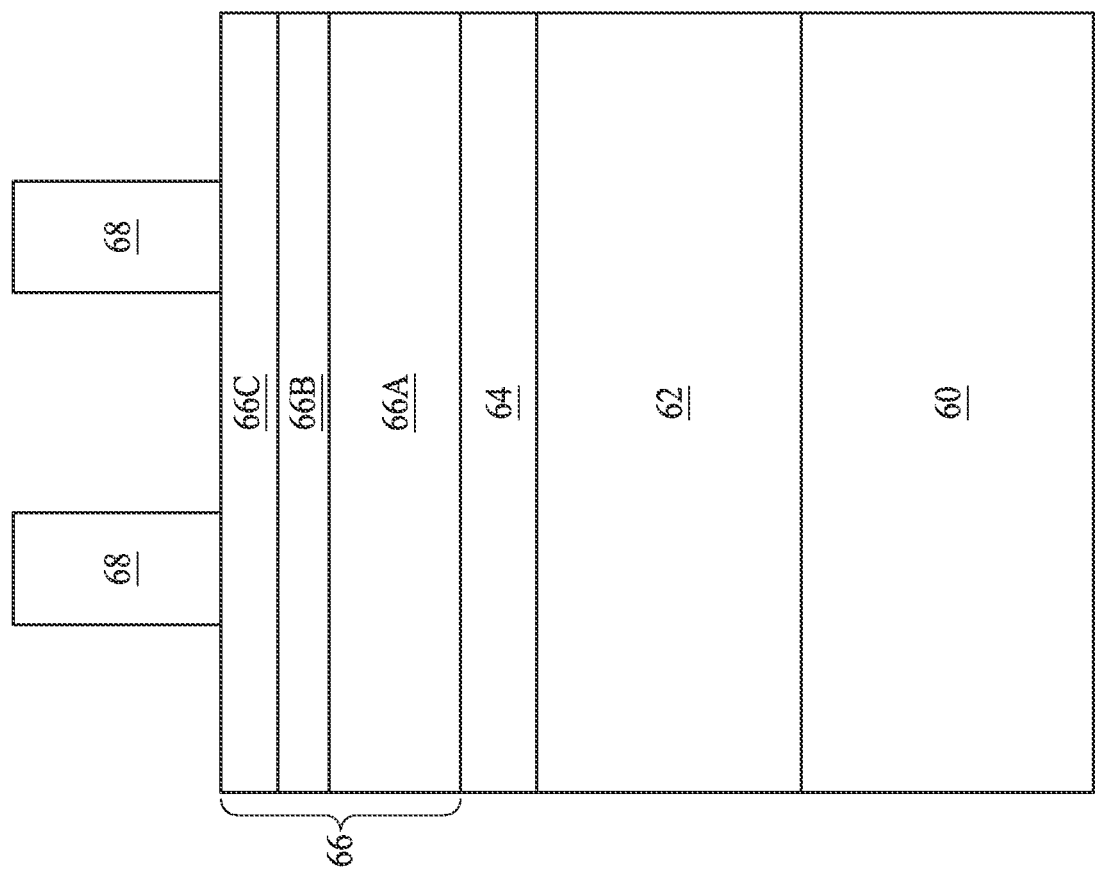
FIG. 6 to FIG. 16 depict cross-sectional views of intermediate stages of an example fabrication process for forming FinFET structure, in accordance with some embodiments of the present disclosure.

Present disclosure provides a method for manufacturing the FinFET structure described herein. Referring to FIG. 6 to FIG. 16, FIG. 6 to FIG. 16 depict cross-sectional views of intermediate stages of an example fabrication process for forming FinFET structure, in accordance with some embodiments of the present disclosure. Referring to FIG. 6, a semiconductor substrate 60 is provided with an overlying insulating layer 62. In some embodiments, the semiconductor substrate 60 and the insulating layer 62 can be a portion of an SOI wafer. In other embodiments, the insulating layer 62 is deposited over the surface of the semiconductor substrate 60 during the manufacturing operations. A hard mask layer 64 and an anti-reflective layer 66 are positioned over the insulating layer 62, for the subsequent patterning of the insulating layer 62 into insulator fins 105 of FIG. 1. A masking pattern layer 68 is positioned over the anti-reflective layer 66, the features of the masking pattern layer 68 aligning with the predetermined positions of the insulator fins over the semiconductor substrate 60.

In some embodiments, the insulating layer 62 can be composed of insulating materials, high-k dielectric material, or semiconductor derivatives, such as $SiO_2$, $HfO_2$, SiOCN, or GeO. In some embodiments, the hard mask layer 64 can be composed of materials having distinct physical and/or chemical properties from the underlying insulating layer 62, for example, a silicon nitride layer. In some embodiments, the anti-reflective layer 66 may include an advanced patterning film (APF) 66A, a silicon oxynitride layer 66B, and an anti-reflective coating 66C stacking form the hard mask layer 64 to the masking pattern layer 68. In some embodiments, the masking pattern layer 68 can be a photoresist layer patterned with conventional techniques.

Figure 7:
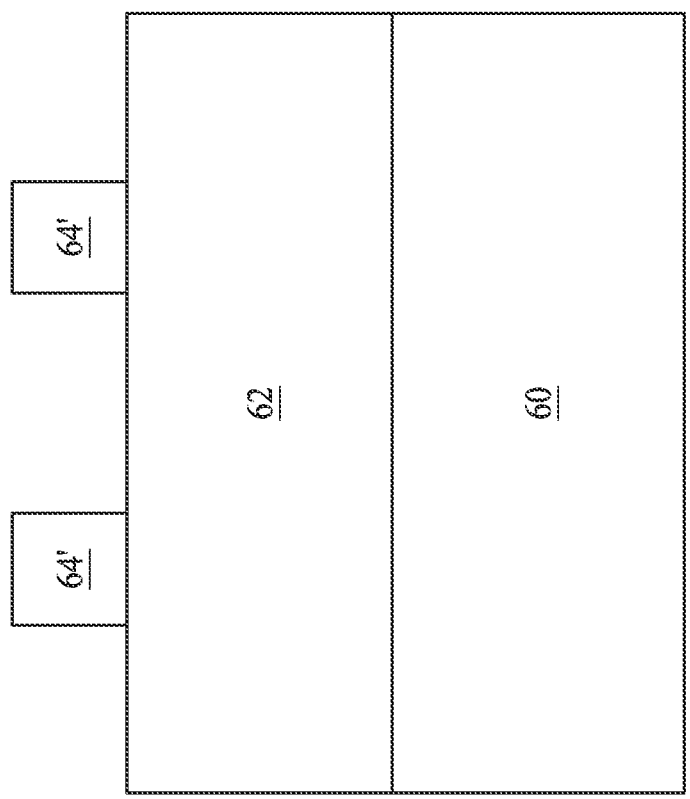
Figure 8:
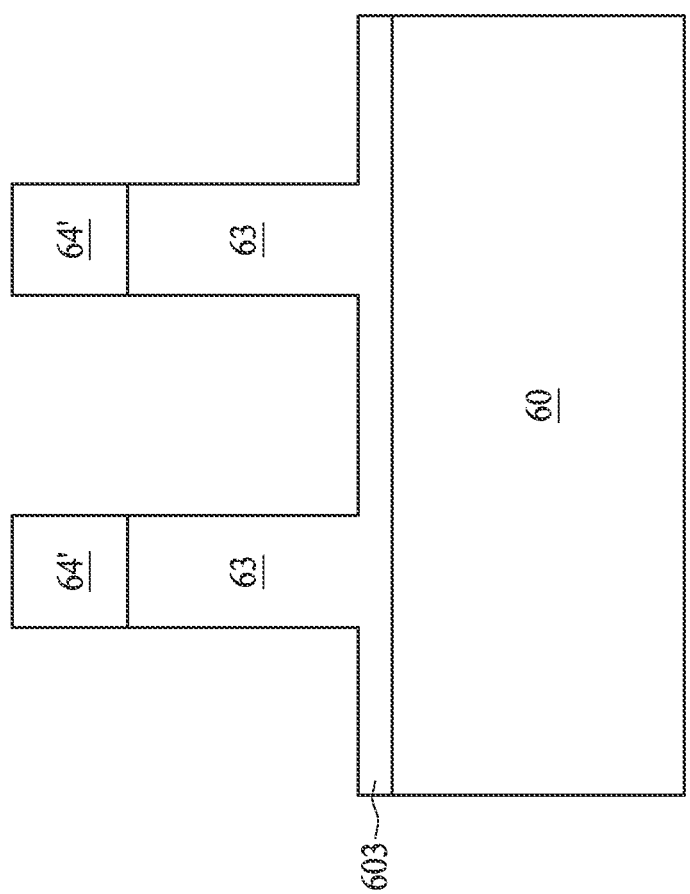

In FIG. 7, an etching operation is performed to pattern the hard mask layer 64. The remaining features of the hard mask layer 64 follows the features of the masking pattern layer 68. Subsequently, the masking pattern layer 68, along with the APF 66A, the silicon oxynitride layer 66B, and the anti-reflective coating 66C, are removed. In FIG. 8, the patterned hard mask layer 64' is utilized in another etching operation, for example, a dry etch operation, a wet etch operation, or combinations thereof, to pattern the insulating layer 62 into an insulator fin 63 and a dielectric layer 603. The etching operation performed to obtain the insulator fin 63 does not consume the entire thickness of the insulating layer 62 at masked positions. Instead, by implementing a time mode etch, a layer of continuous insulating material is deliberately preserved to form the dielectric layer 603, or as previously discussed, the dielectric layer 103 in the FinFET device 10 of FIG. 1. The patterned hard mask layer 64' is subsequently removed, as shown in FIG. 9.

Figure 9:
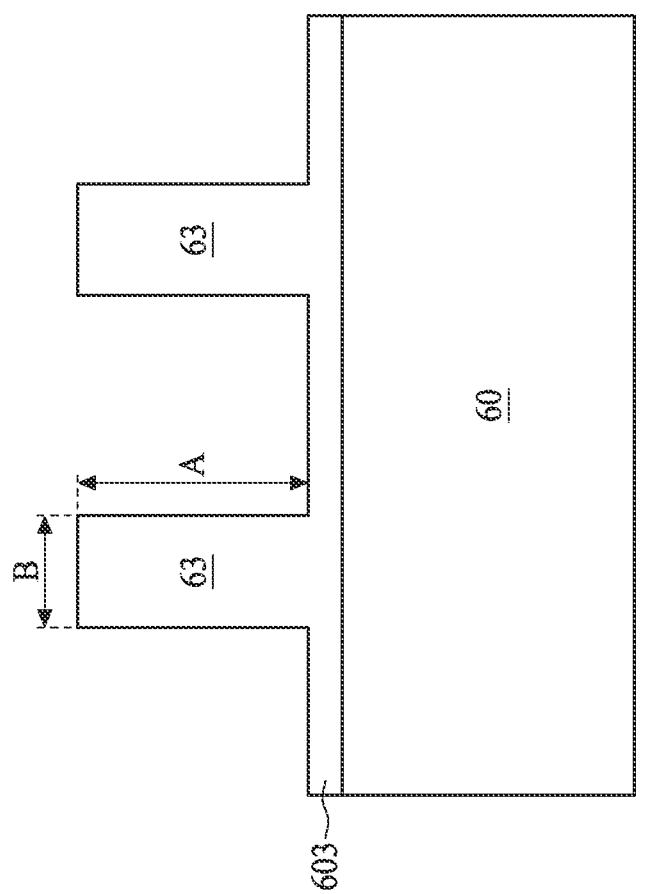

In FIG. 9, each of the plurality of insulator fins 63 has a principal dimension A, as opposed to a minor dimension B. The principal dimension A is substantially perpendicular to the top surface of the substrate 60. In some embodiments, the principal dimension A is in a range of from about 5 nm to about 100 nm, and the minor dimension B is in a range of from about 2 nm to about 30 nm. Criticalities of having the principal dimension A and minor dimension B within the aforesaid range can be referred to FIG. 2A and is not repeated here for brevity. From a perspective view, the insulator fins 63 of FIG. 9 extends along a first direction 11 (see FIG. 1) over the semiconductor substrate 60 and form an insulator stripe.

Figure 10:
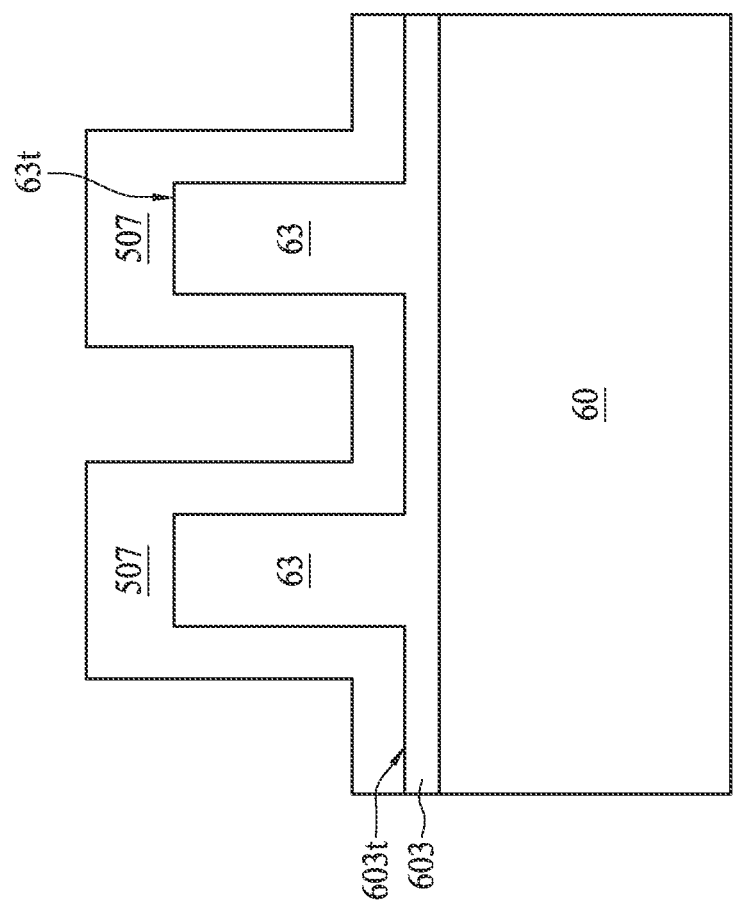

In FIG. 10, a capping layer 507 is continuously formed over the insulator fins 63, or alternatively stated, over the insulator stripe, from a perspective view. A top surface 63t and a sidewall 63s of the insulator fin 63, as well as a top surface of dielectric layer 603, are covered with the deposited capping layer 507. In some embodiments, the capping layer 507 can be composed of crystalline, poly-crystalline, or semi-crystalline semiconductor materials such as Si, SiGe, Ge, other III-V materials, or 2-dimensional materials such as graphene, $MoS_2$, $WSe_2$, or $HfTe_2$. In some embodiments, prior to depositing the capping layer materials, the insulator fin 63 and the dielectric layer 603 undergo an annealing operation, followed by depositing the crystalline, poly-crystalline, or semi-crystalline semiconductor materials as the capping layer 507. Alternatively, in some embodiments, the capping layer materials are first deposited over the insulator fin 63 and the dielectric layer 603 regardless of their crystallinity states, and then followed by an annealing operation to crystallize the capping layer materials into crystalline, poly-crystalline, or semi-crystalline phase.

Figure 11:
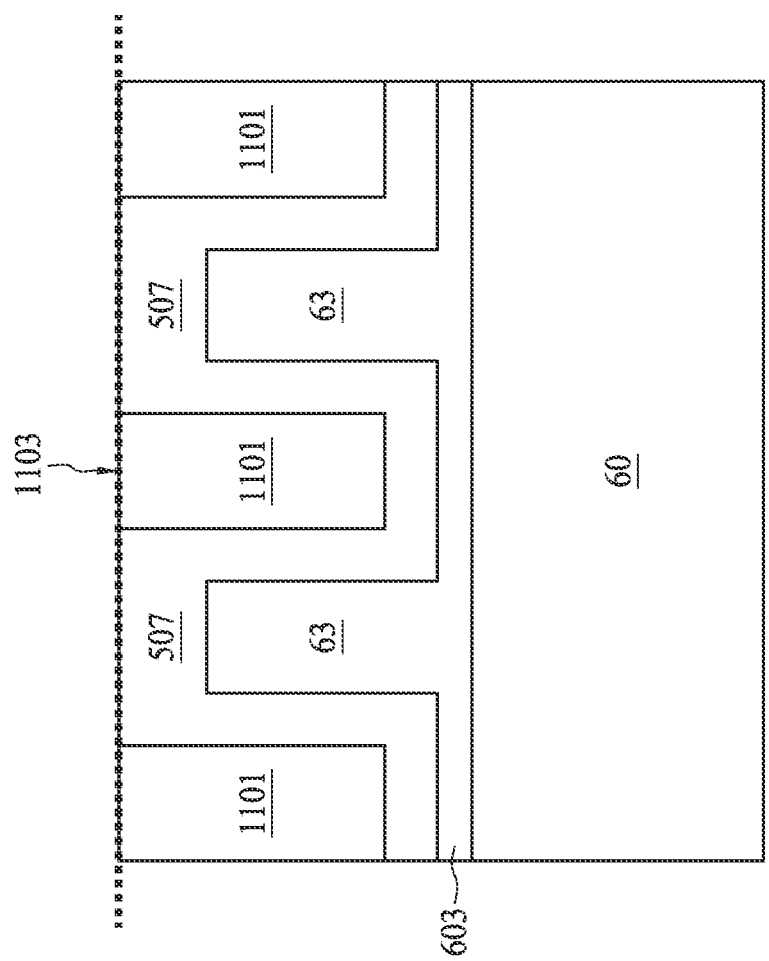

FIG. 11 to FIG. 16 show operations for discontinuing, or cutting off, the capping layer 507 between adjacent insulator fins 63. In FIG. 11, an insulating layer 1101 if blanket formed over the capping layer 507-covered insulator fins 63. The insulating layer 1101 may conform to the morphology of the underlying insulator fins 63. A planarization operation, for example, a chemical mechanical polishing (CMP) operation is performed to obtain a leveled top surface 1103 between the insulating layer 1101 and the portion of the capping layer 507 deposited over the top surface 63t of the insulator fin 63. In some embodiments, the insulating layer 1101 deposited herein can be composed of substantially identical materials as the insulating layer 62 of FIG. 6.

Figure 12:
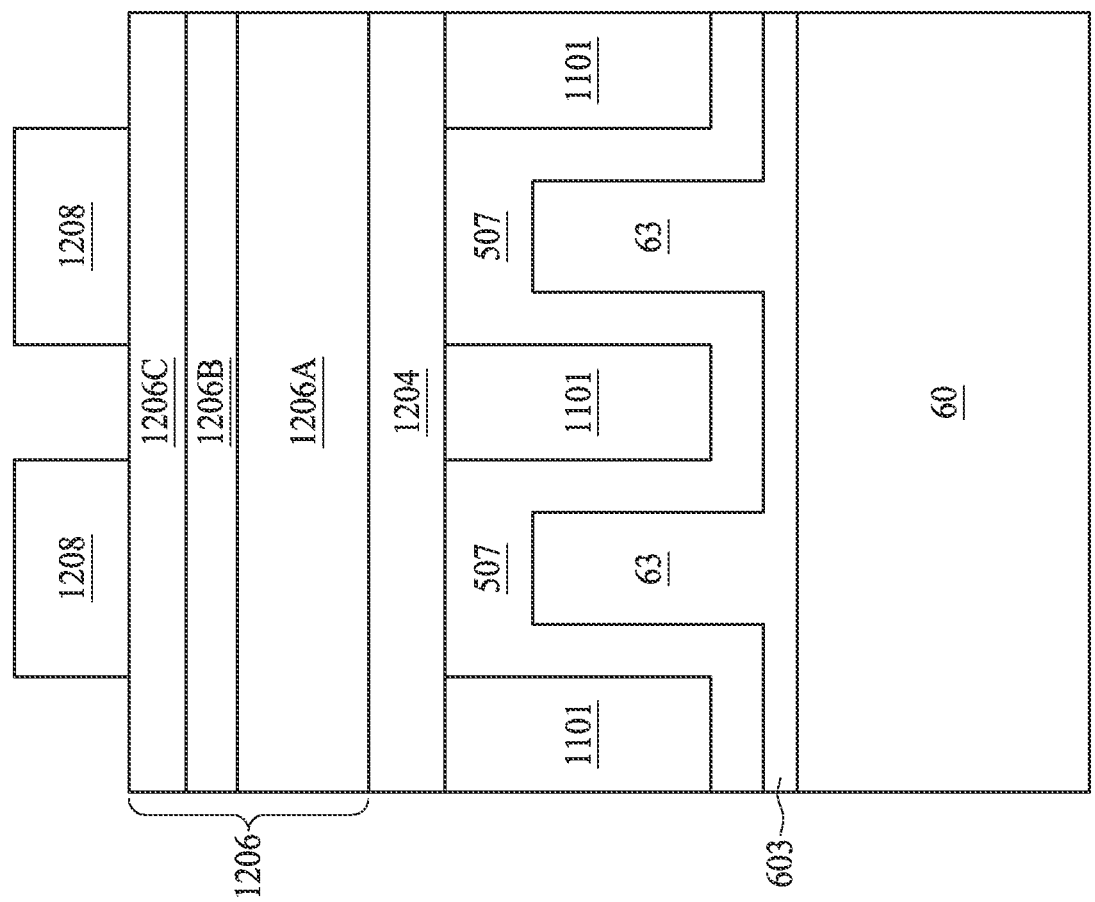

In FIG. 12, a hard mask layer 1204, an anti-reflective layer 1206, and a masking layer 1208 are formed over the leveled top surface 1103, for the subsequent patterning of capping layer 507. A masking pattern layer 1208 is positioned over the anti-reflective layer 1206, the features of the masking pattern layer 1208 aligning with the positions of the insulator fins 63 over the semiconductor substrate 60.

In some embodiments, the hard mask layer 1204 can be composed of materials having distinct physical and/or chemical properties from the underlying insulating layer 1101, for example, a silicon nitride layer. In some embodiments, the anti-reflective layer 1206 may include an advanced patterning film (APF) 1206A, a silicon oxynitride layer 1206B, and an anti-reflective coating 1206C stacking form the hard mask layer 1204 to the masking pattern layer 1208. In some embodiments, the masking pattern layer 1208 can be a photoresist layer patterned with conventional techniques.

Figure 13:
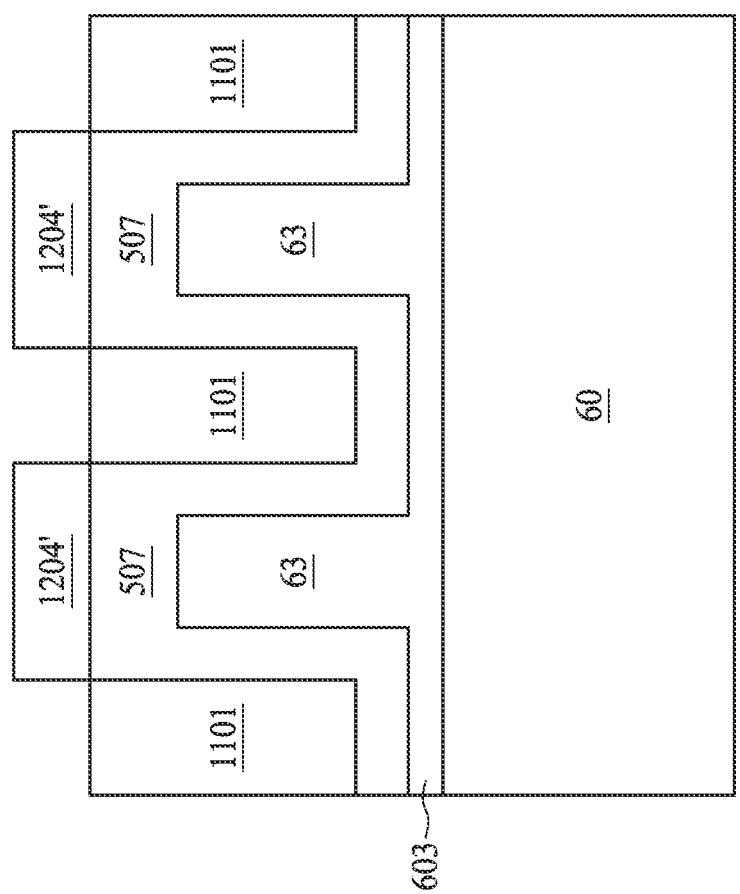
Figure 14:
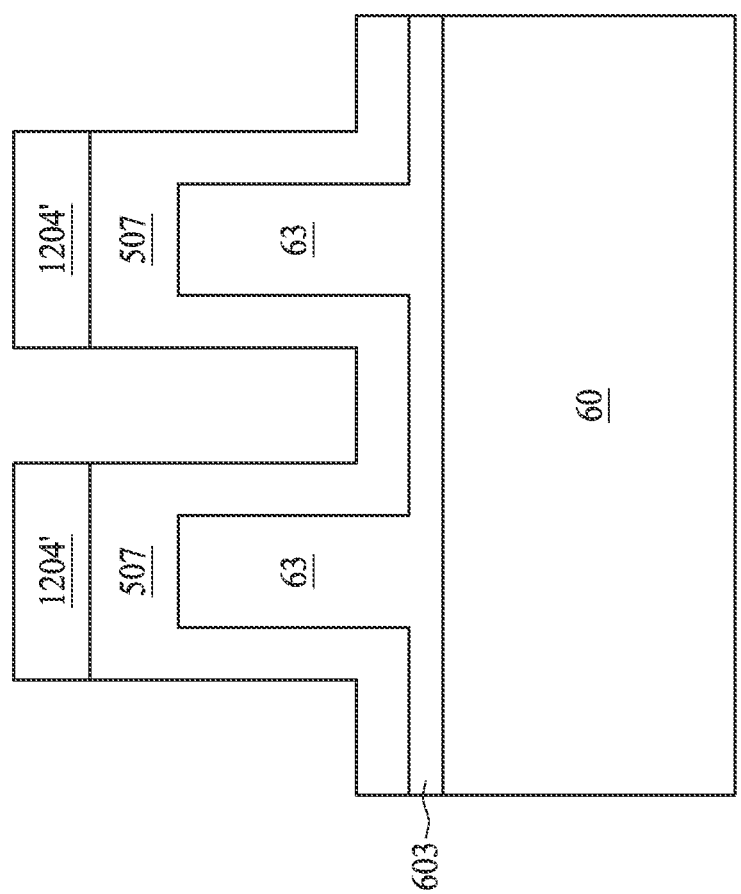

In FIG. 13, an etching operation is performed to pattern the hard mask layer 1204. The remaining features of the hard mask layer 1204 follows the features of the masking pattern layer 1208. Subsequently, the masking pattern layer 1208, along with the APF 1206A, the silicon oxynitride layer 1206B, and the anti-reflective coating 1206C, are removed. In FIG. 14, the patterned hard mask layer 1204' is utilized in another etching operation, for example, a dry etch operation, a wet etch operation, or combinations thereof, to remove the insulating layer 1101. The etching operation stops until the exposure of the capping layer 507, which is previously covered by the insulating layer 1101. An etching chemistry having sufficient materials selectivity between the insulating layer 1101 and the capping layer 507 can be used. For example, an etchant removing oxide material at a rate at least ten times faster than removing semiconductor material can be used in the etching operation of FIG. 14.

As previously discussed in FIG. 2A, the capping layer thinner than 40 Å can raise manufacturing difficulties in subsequent manufacturing operation. For example, in the operation described in FIG. 14, when the capping layer 507 is thinner than 40 Å, the aforesaid etchant selectivity may not be sufficient to carry out the etching operation without consuming relatively substantial amount of the thin capping layer 507. Consequently, the thin capping layer 507 can be fully consumed at various locations along the top surface 63t and the sidewall 63s of the insulator fin 63, thereby damaging the active region or the channel of the FinFET device. As a result, depositing a capping layer 507 with a suitable thickness, for example, greater than 40 Å, in consideration of the etching processing window or selectivity is required.

Figure 15:
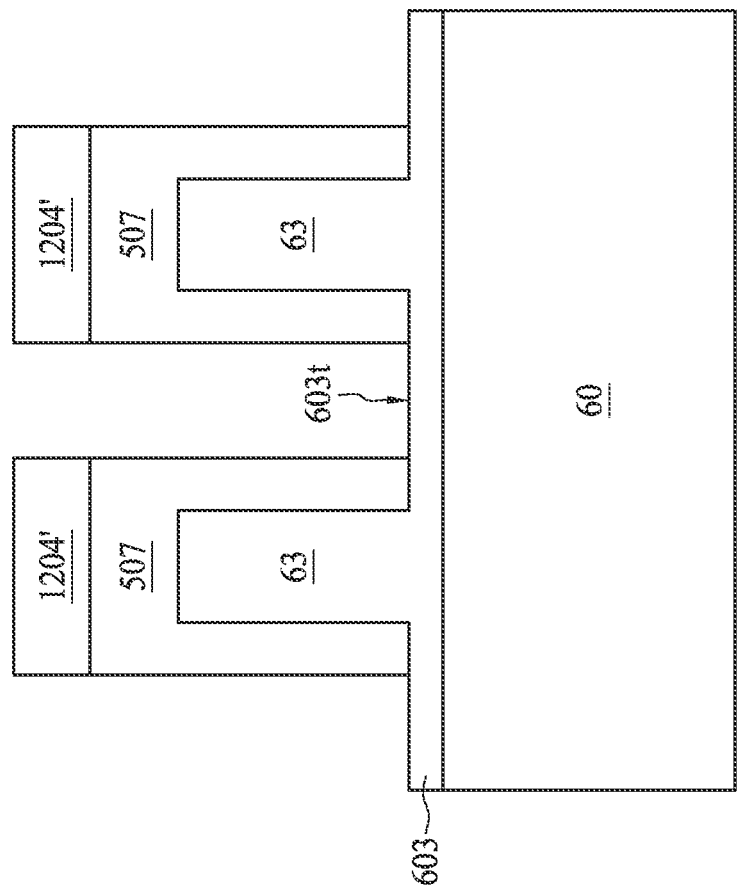
Figure 16:
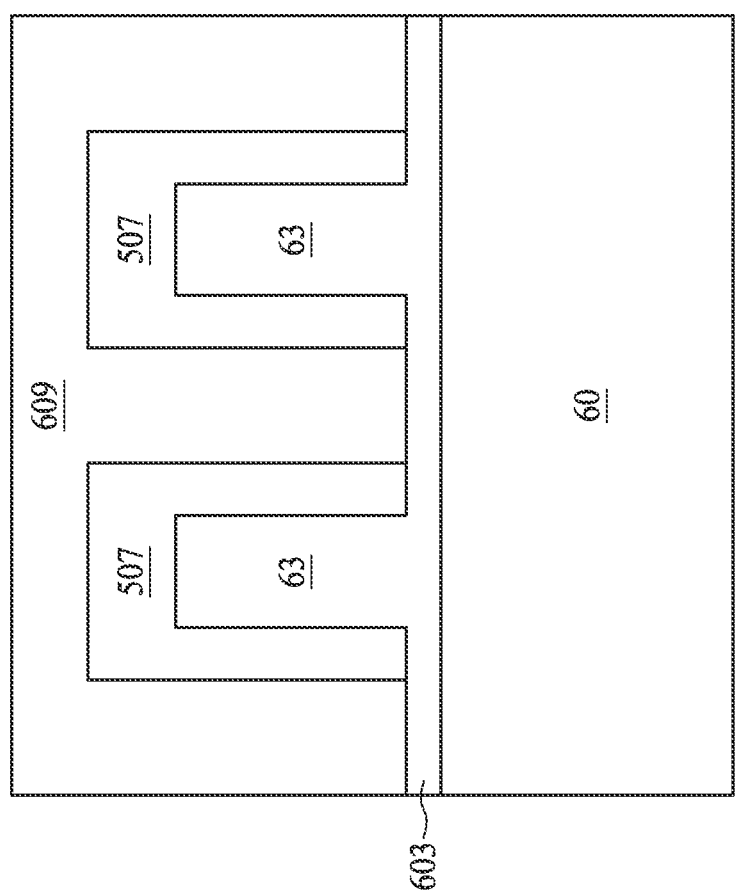

In FIG. 15, the patterned hard mask layer 1204' is utilized in another etching operation, for example, a dry etch operation, a wet etch operation, or combinations thereof, to remove the portion of the capping layer disposed on the top surface of the dielectric layer 603. The etching operation stops until the exposure of the dielectric layer 603, which is previously covered by the capping layer 507. An etching chemistry having sufficient materials selectivity between the dielectric layer 603 and the capping layer 507 can be used. For example, an etchant removing semiconductor material at a rate at least ten times faster than removing dielectric material can be used in the etching operation of FIG. 15. The patterned hard mask layer 1204' is subsequently removed, as shown in FIG. 16. A gate 609 is formed, crossing over the plurality of insulator fins 63 after cutting off the capping layers 507 between adjacent insulator fins 63. From a perspective view, the gate 609 appears as a gate stripe extending along a second direction over the semiconductor substrate 60. The gate 609 may include a polysilicon gate or a replacement gate (e.g., a metal gate). The second direction 12 may be substantially perpendicular to the first direction 11, as previously illustrated in FIG. 1.

Figure 17A:
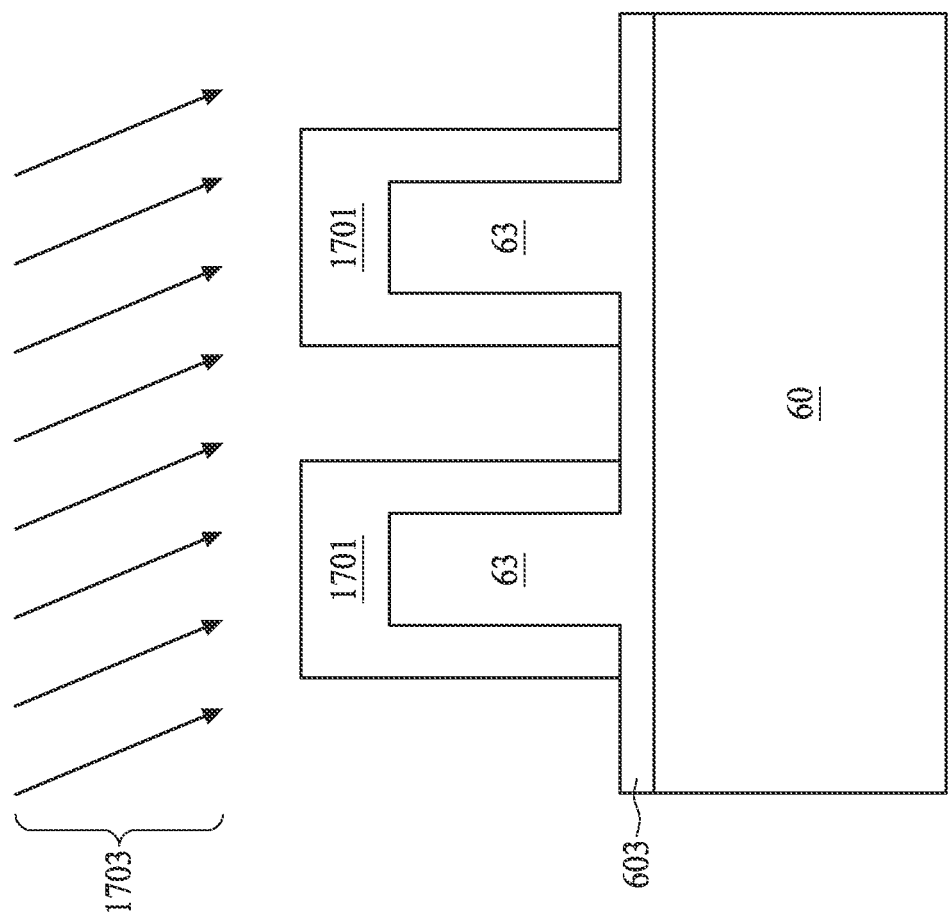
FIG. 17A is a cross sectional view of a FinFET under various manufacturing operations, in accordance with some embodiments of the present disclosure.
Figure 17B:
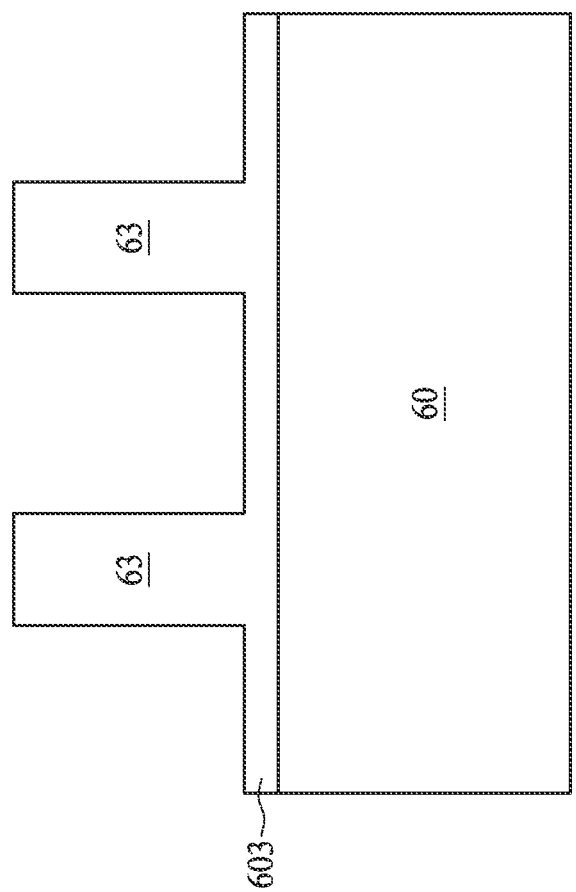
FIG. 17B to FIG. 17B' are cross sectional views of a FinFET under various manufacturing operations, in accordance with some embodiments of the present disclosure.
Figure 17B:
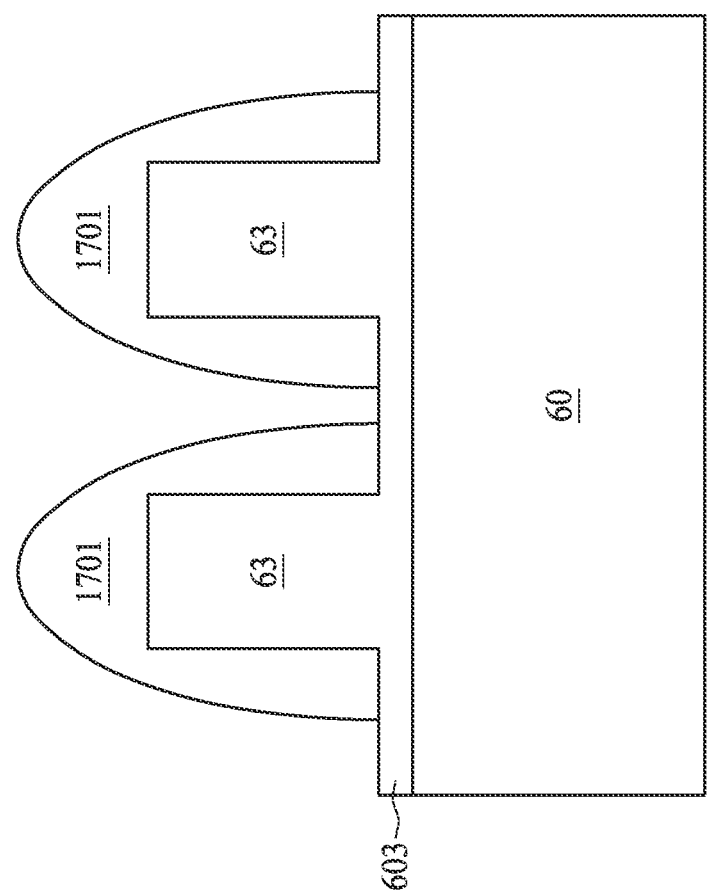
Figure 17C:
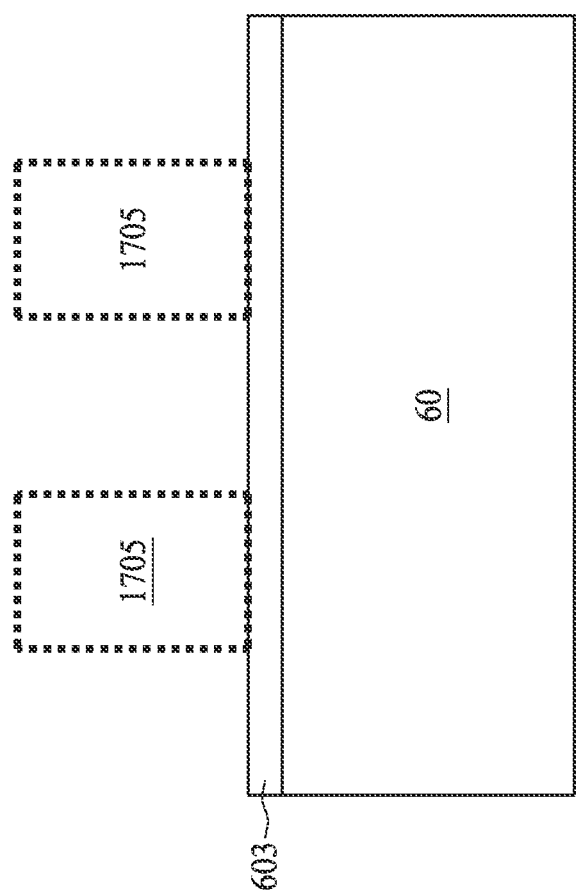
FIG. 17C to FIG. 17C' are cross sectional views of a FinFET under various manufacturing operations, in accordance with some embodiments of the present disclosure.
Figure 17C:
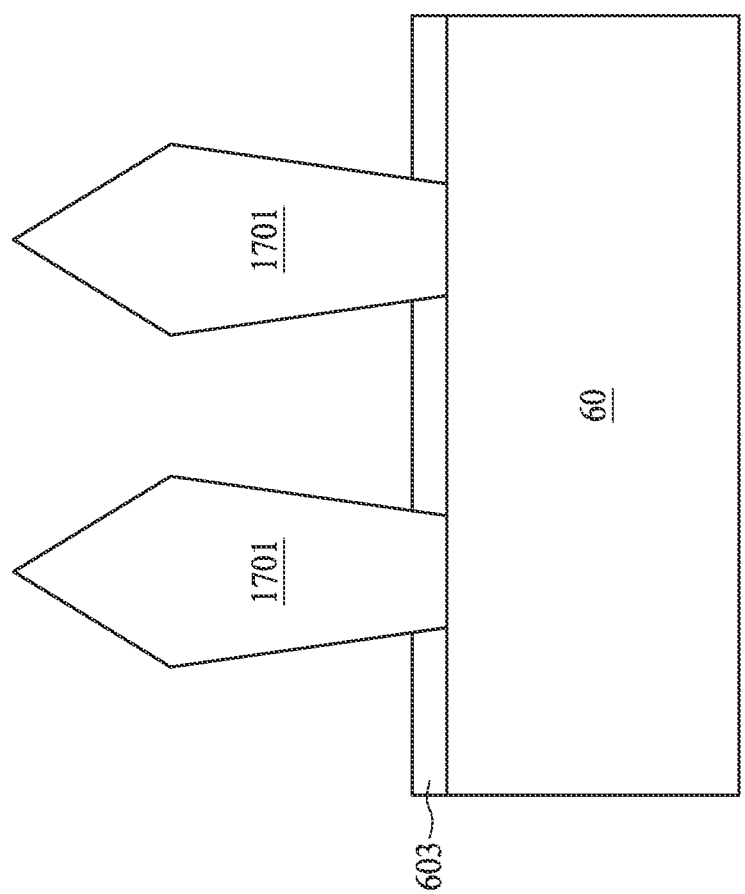

FIG. 17A, FIG. 17B, FIG. 17B', FIG. 17C, and FIG. 17C' are cross sectional views of a FinFET under various manufacturing operations, in accordance with some embodiments of the present disclosure. In FIG. 17A, a conductible region 1701, which represents a portion of the capping layer 507 not covered by the gate 609 and laterally abutting the gate 609, is formed by an ion implantation operation 1703. For example, the portion of the aforesaid capping layer 507 receives ion implantation with sufficient dosage to form a source or a drain region over the insulator fins 63. Suitable annealing operation may be conducted after the implantation operation at the portion of the capping layer 507.

In FIG. 17B and FIG. 17B', the originally deposited capping layer 507 is removed by an etching operation similar to that disclosed in FIG. 15 but without the patterned hard mask layer 1204', followed by an epitaxial regrowth operation to form a conductible region 1701 with desired regrown materials or conductible materials. The regrown materials or conductible materials can be different from the original capping layer materials. The regrown materials or conductible materials include, but not limited to, SiGe, SiC, Ge, graphene, $MoS_2$, $WSe_2$, or $HfTe_2$, or combinations thereof. In some embodiments, prior to depositing the regrown materials or conductible materials, the insulator fin 63 and the dielectric layer 603 undergo an annealing operation, followed by depositing the crystalline, poly-crystalline, or semi-crystalline semiconductor materials as the conductible region. Alternatively, in some embodiments, the regrown materials or conductible materials are first deposited over the insulator fin 63 and the dielectric layer 603 regardless of their crystallinity states, and then followed by an annealing operation to crystallize the regrown materials or conductible materials into crystalline, poly-crystalline, or semi-crystalline phase. Suitable etching operation cutting off regrown materials or conductible materials at the adjacent insulator fins 63 may be performed if the regrown materials or conductible materials merge. The conductible region 1701' may be grown to possess several facets (not shown) or having a rounding surface as shown in FIG. 17B'.

In FIG. 17C and FIG. 17C', the originally deposited capping layer 507 and the original insulator fins 63 are removed by an etching operation, followed by an epitaxial regrowth operation to form a conductible region 1701 with desired regrown materials or conductible materials. The capping layer 507 and the insulator fins 63 can be removed partially or in their entirety. As shown in FIG. 17C, the removed portion of the capping layer 507 and the insulator fins 63 form a recess 1705 delineated by dotted lines, or the recess 1705 can be observed along the insulator stripe from a perspective view. The regrown materials or conductible materials are then deposited in and filling the recess 1705 to obtain the conductible region 1701', as shown in FIG. 17C'. In some embodiments, the dielectric layer 603 underlying the recess 1705 may also be removed in another lithography operation for the exposure of the underlying semiconductor substrate 60. The regrown materials or conductible materials can then be epitaxially grown over the exposed semiconductor substrate 60.

The regrown materials or conductible materials can be different from the original capping layer materials. The regrown materials or conductible materials include, but not limited to, SiGe, SiC, Ge, graphene, $MoS_2$, $WSe_2$, or $HfTe_2$, or combinations thereof. In some embodiments, when the dielectric layer 603 underlying the recess 1705 is not removed prior to the regrown operation, the dielectric layer 603 undergo an annealing operation, followed by depositing the crystalline, poly-crystalline, or semi-crystalline semiconductor materials as the conductible region 1701. Alternatively, in some embodiments, the regrown materials or conductible materials are first deposited over the dielectric layer 603 regardless of their crystallinity states, and then followed by an annealing operation to crystallize the regrown materials or conductible materials into crystalline, poly-crystalline, or semi-crystalline phase. Suitable etching operation cutting off regrown materials or conductible materials at the adjacent conductible regions 1701 may be performed if the regrown materials or conductible materials merge. The conductible region 1701 may be grown to possess several facets as shown in FIG. 17C' or having a rounding surface as shown in FIG. 17B'.

Figure 18B:
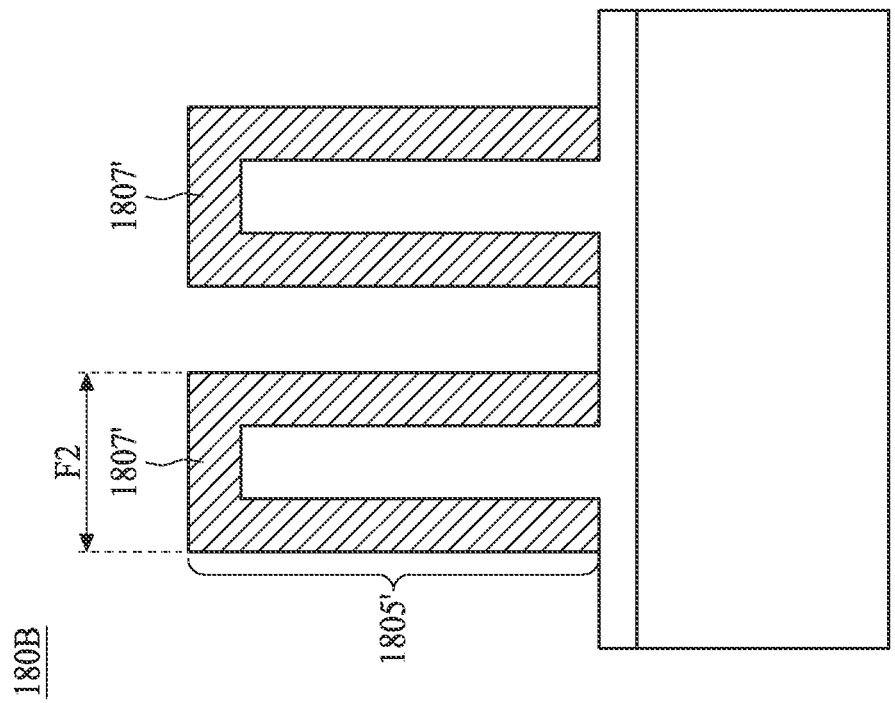
FIG. 18B is a cross sectional view of a FinFET, in accordance with some embodiments of the present disclosure.
Figure 18A:
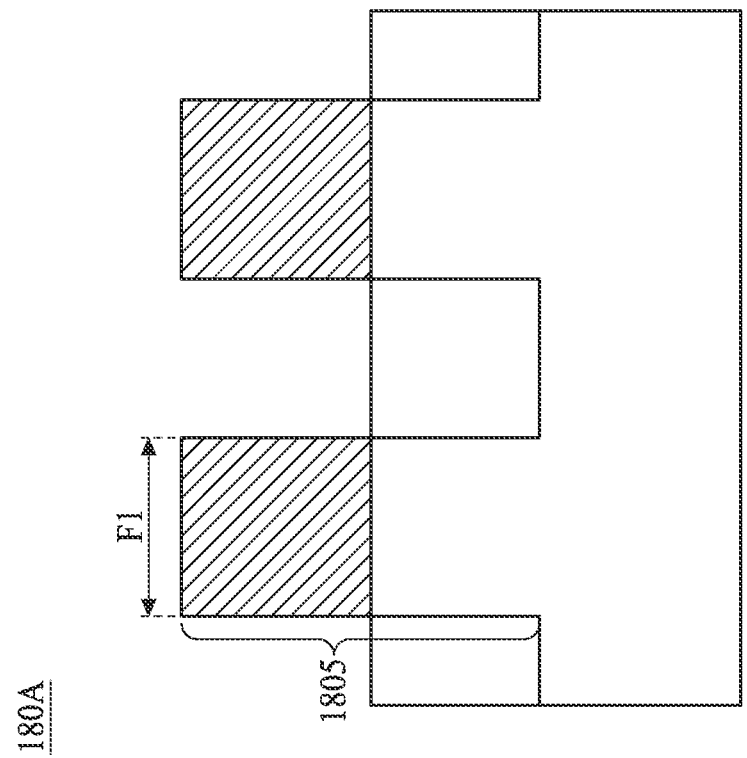
FIG. 18A is a cross sectional view of a FinFET, in accordance with some comparative embodiments of the present disclosure.

Referring to FIG. 18A and FIG. 18B, FIG. 18A is a cross sectional view of a comparative FinFET structure, and FIG. 18B is a cross sectional view of a FinFET of present embodiments. By utilizing the FinFET structure of present disclosure, FinFET structures 180A and 180B having identical fin width F1, for example, 8 nm, can have different threshold voltages. The hatched regions associated with the fin structures 1805, 1805' indicate depletion regions generated under corresponding threshold bias. To achieve fully depletion in FinFET structure 180A, a threshold voltage Vt1 is required to deplete carriers from the entire semiconductor fin 1805 having a fin width F1, for example. To achieve fully depletion in FinFET structure 180B, a threshold voltage Vt2 is required to deplete carriers from the capping layer 1807' over the insulator fin 1805', the widths of the capping layer 1807' and the insulator fin 1805' constitute the fin width F1, for example. The threshold voltage Vt2 applied to the FinFET structure 180B is substantially lower than the threshold voltage Vt1 applied to the FinFET structure 180A.

Figure 19B:
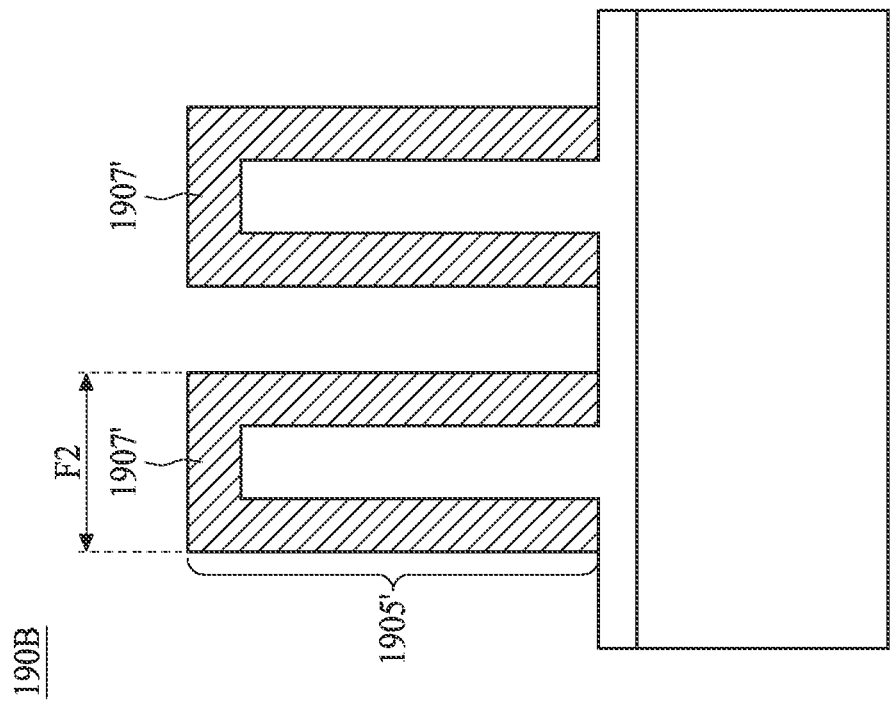
FIG. 19B is a cross sectional view of a FinFET, in accordance with some embodiments of the present disclosure.
Figure 19A:
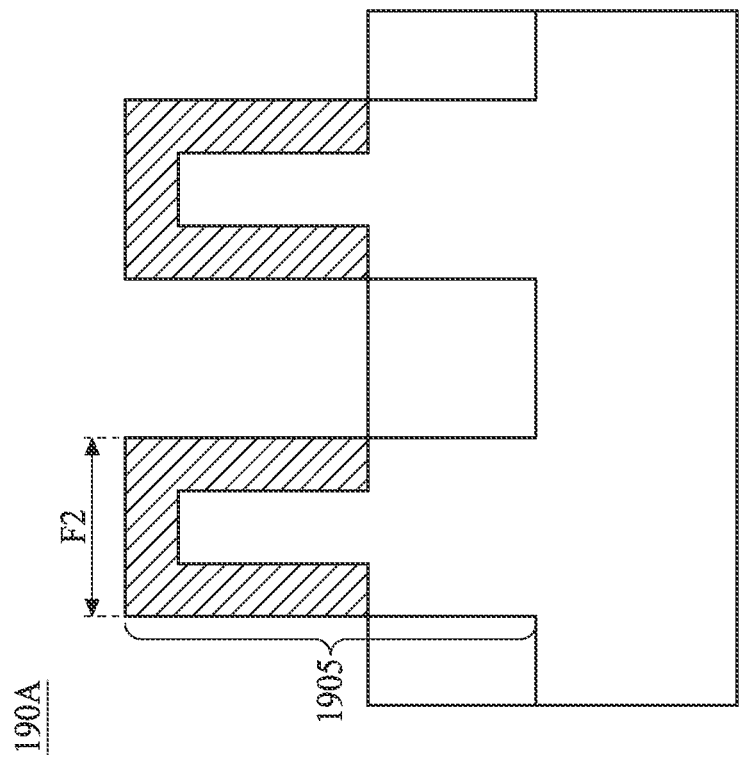
FIG. 19A is a cross sectional view of a FinFET, in accordance with some comparative embodiments of the present disclosure.

Referring to FIG. 19A and FIG. 19B, FIG. 19A is a cross sectional view of a comparative FinFET structure, and FIG. 19B is a cross sectional view of a FinFET of present embodiments. By utilizing the FinFET structure of present disclosure, FinFET structures 190A and 190B having identical fin width F2, for example, 16 nm, can have different degrees of depletions. The hatched regions associated with the fin structure 1905, 1905' indicate depletion regions generated under a predetermined bias. When applying the predetermined bias on the FinFET structure 190A, the semiconductor fin 1905 generates a depletion region at the top surface and the sidewalls of the semiconductor fin 1905, however, the semiconductor fin 1905 is not fully depleted, therefore, possible leakage may occur due to short channel effect. When applying the predetermined bias on the FinFET structure 190B, the semiconductor fin 1905' generates a depletion region in the capping layer 1907' over the insulator fin 1905', and the capping layer achieves fully depletion, preventing leakage from occurring.

Some embodiments of the present disclosure provides a semiconductor structure, including a semiconductor substrate, an insulator fin over the semiconductor substrate, the insulator fin having a principle dimension, from a cross sectional perspective, perpendicular to a top surface of the semiconductor substrate, and a semiconductor capping layer cover the insulator fin along the principle dimension.

Some embodiments of the present disclosure provides a semiconductor structure, including a semiconductor substrate, a first stripe extending along a first direction, and a second stripe extending along a second direction substantially perpendicular to the first direction. The first stripe including an insulator core and a semiconductor cap covering a top surface and a sidewall of the insulator core. The second stripe is in contact with the semiconductor cap of the first stripe.

Some embodiments of the present disclosure also provides a method for manufacturing a semiconductor structure. The method includes patterning an insulator stripe over a semiconductor substrate, depositing a semiconductor capping layer continuously over the insulator stripe, and cutting off the semiconductor capping layer between the insulator stripes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
    a semiconductor substrate, comprising a gate region;
    an insulator fin over the semiconductor substrate, the insulator fin having a principle dimension, from a cross sectional perspective, perpendicular to a top surface of the semiconductor substrate;
    a semiconductor capping layer covering the insulator fin along the principle dimension and a top surface of the insulator fins; and
    a gate structure, wherein the gate structure is in physical contact with the semiconductor capping layer at the top surface and along the principal dimension of the insulator fin over the gate region, and a first portion of the semiconductor capping layer covered by the gate structure being configured as a channel structure, wherein a second portion of the semiconductor capping layer adjacent to the first portion is configured as a source/drain region, the second portion of the semiconductor capping layer is exposed from the gate structure and abutting the gate structure.

2. The semiconductor structure of claim 1, wherein a lowermost surface of the gate structure is coplanar with a lowermost surface of the semiconductor capping layer.

3. The semiconductor structure of claim 1, wherein a lowermost surface of the gate structure is coplanar with a lowermost surface of the insulator fin.

4. The semiconductor structure of claim 1, wherein the semiconductor capping layer comprises graphene.

5. The semiconductor structure of claim 1, wherein the semiconductor capping layer comprises Si, Ge, SiGe, $MoS_2$, $WSe_2$, or $HfTe_2$.

6. The semiconductor structure of claim 1, further comprising an insulator layer between the insulator fin and the semiconductor substrate.

7. The semiconductor structure of claim 1, wherein the semiconductor capping layer comprises crystalline material and the insulator fin comprises $SiO_2$, $HfO_2$, SiOCN, or GeO.

8. The semiconductor structure of claim 1, wherein the thickness of the capping layer is in a range of from 40 Å to 20 nm.

9. A semiconductor structure, comprising:
    a semiconductor substrate, comprising a gate region;
    a first stripe extending along a first direction, the first stripe comprising:
       an insulator core; and
       a semiconductor cap covering a top surface and a sidewall of the insulator core, wherein the semiconductor cap comprises crystalline materials; and
    a second stripe extending along a second direction substantially perpendicular to the first direction and being in direct contact with the semiconductor cap of the first stripe, wherein the second stripe is configured as a gate structure, a first portion of the semiconductor cap covered by the second stripe is configured as a channel structure, wherein a second portion of the semiconductor cap adjacent to the first portion is configured as a source/drain region, wherein a lowermost surface of the insulator core is level with a lowermost surface of the semiconductor cap.

10. The semiconductor structure of claim 9, wherein a lowermost surface of the second stripe is level with the lowermost surface of the semiconductor cap.

11. The semiconductor structure of claim 9, wherein a thickness of the semiconductor cap allowing formation of a fully depleted region in the semiconductor cap under a predetermined bias.

12. The semiconductor structure of claim 9, further comprising an insulating layer between the first stripe and the semiconductor substrate.

13. The semiconductor structure of claim 9, further comprising a conductible region in the semiconductor cap of the first stripe, the conductible region abutting the second stripe.

14. The semiconductor structure of claim 9, wherein the semiconductor cap comprises graphene.

15. The semiconductor structure of claim 9, wherein the semiconductor cap comprises Si, Ge, SiGe, $MoS_2$, $WSe_2$, or $HfTe_2$.

16. A method for manufacturing a semiconductor structure, comprising:
    forming a dielectric layer over a semiconductor substrate;

patterning an insulator stripe over the semiconductor substrate, comprising forming an insulator layer over the semiconductor substrate and at a bottom of the insulator stripe;

depositing a semiconductor capping layer continuously over the insulator stripe, wherein the semiconductor capping layer comprises crystalline materials, wherein the semiconductor capping layer is free from being in direct contact with the semiconductor substrate;

cutting off the semiconductor capping layer between the insulator stripes, wherein at least a portion of the dielectric layer is exposed from the semiconductor capping layer;

forming a gate, wherein the gate is in direct contact with the semiconductor capping layer, a first portion of the semiconductor capping layer covered by the gate is configured as a channel structure; and forming a conductible region at a portion of the insulator stripe.

17. The method of claim 16, wherein a lowermost surface of the gate is coplanar with a lowermost surface of the semiconductor capping layer.

18. The method of claim 16, wherein a lowermost surface of the gate is coplanar with a lowermost surface of the insulator stripe.

19. The method of claim 16, wherein the semiconductor capping layer comprises graphene.

20. The method of claim 16, wherein the semiconductor capping layer comprises Si, Ge, SiGe, $MoS_2$, $WSe_2$, or $HfTe_2$.

* * * * *